United States Patent
Alibert et al.

(10) Patent No.: US 11,205,892 B2
(45) Date of Patent: Dec. 21, 2021

(54) METHOD FOR LOCATING PHASE FAULTS IN A MICROGRID

(71) Applicant: Schneider Electric Industries SAS, Rueil Malmaison (FR)

(72) Inventors: Philippe Alibert, Lans-en-Vercors (FR); Vanya Ignatova, Saint Martin d'Hères (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 85 days.

(21) Appl. No.: 16/418,092

(22) Filed: May 21, 2019

(65) Prior Publication Data

US 2020/0044436 A1 Feb. 6, 2020

(30) Foreign Application Priority Data

Jul. 31, 2018 (EP) .................................... 18306032

(51) Int. Cl.
*H02H 3/08* (2006.01)
*G01R 19/165* (2006.01)
(Continued)

(52) U.S. Cl.
CPC ....... *H02H 3/081* (2013.01); *G01R 19/16547* (2013.01); *G05F 1/66* (2013.01);
(Continued)

(58) Field of Classification Search
CPC ............ H02H 3/081; H02H 3/32; H02H 7/26; H02H 7/261; H02H 7/263; H02H 7/267; H02H 7/266; H02H 1/007; H02H 3/28; H02H 7/22; G01R 19/16547; G01R 31/08; G05F 1/66; H02J 3/38; H02J 3/0012;
(Continued)

(56) References Cited

U.S. PATENT DOCUMENTS

| | | | |
|---|---|---|---|
| 2007/0085549 A1* | 4/2007 | Fischer | G01R 31/50 324/521 |
| 2008/0158750 A1 | 7/2008 | Premerlani et al. | |

(Continued)

FOREIGN PATENT DOCUMENTS

EP 2194656 6/2010

OTHER PUBLICATIONS

Yin, X. et al., "Strategy Research of Low Voltage Photovoltaic Microgrid Protection", 2014 IEEE PES Asia-Pacific Power and Energy Engineering Conference, Dec. 7, 2014, 6 pages.
(Continued)

*Primary Examiner* — Gustavo A Rosario-Benitez
(74) *Attorney, Agent, or Firm* — Locke Lord LLP

(57) ABSTRACT

A method for locating phase faults in a microgrid in off-grid mode. The method includes obtaining a grid topology of the microgrid having at least two busbars and determining the position of all circuit breaker position of the grid topology. Further, acquiring measurement data which includes current magnitude and voltage magnitude. Monitoring the at least two busbars for a voltage dip in one of phase-to-phase or phase-to-neutral voltages. On detecting a voltage dip, determining a defect phase having a minimum phase-to-neutral voltage value. And for the defect phase performing busbar analysis and feeder analysis, using phase-directional information.

11 Claims, 4 Drawing Sheets

(51) Int. Cl.
*G05F 1/66* (2006.01)
*H02H 3/32* (2006.01)
*H02H 7/26* (2006.01)
*H02J 3/38* (2006.01)

(52) U.S. Cl.
CPC ............... *H02H 3/32* (2013.01); *H02H 7/26* (2013.01); *H02J 3/38* (2013.01)

(58) Field of Classification Search
CPC ...... H02J 3/381; H02J 13/00006; H02J 13/00; H02J 13/00034; H02J 13/0004; H02J 3/382; H02J 2003/388; H02J 2003/001
See application file for complete search history.

(56) References Cited

U.S. PATENT DOCUMENTS

| | | | | |
|---|---|---|---|---|
| 2010/0002348 | A1* | 1/2010 | Donolo | H02H 7/261 361/64 |
| 2011/0282507 | A1* | 11/2011 | Oudalov | H02H 3/006 700/292 |
| 2011/0298283 | A1* | 12/2011 | Sannino | B63J 3/04 307/38 |
| 2013/0215543 | A1* | 8/2013 | Hoeven | H02H 3/081 361/63 |
| 2014/0375133 | A1* | 12/2014 | McCarthy | H02J 9/066 307/68 |
| 2015/0261240 | A1 | 9/2015 | Mokhtari et al. | |
| 2018/0159327 | A1* | 6/2018 | Fidigatti | H02J 3/14 |
| 2018/0316188 | A1* | 11/2018 | Ishchenko | H02H 7/28 |
| 2018/0364293 | A1* | 12/2018 | Li | G01R 31/08 |
| 2019/0097410 | A1* | 3/2019 | Valtari | G05F 1/66 |
| 2019/0319450 | A1* | 10/2019 | Jung | H02H 7/22 |
| 2019/0319481 | A1* | 10/2019 | Jin | G01R 31/08 |
| 2019/0348832 | A1* | 11/2019 | Jang | H02H 1/0069 |

OTHER PUBLICATIONS

Extended European Search Report for European Patent Application No. 18306032.6 dated Sep. 13, 2018, 7 pages.

Extended European Search Report for European Patent Application No. 18306031.8 dated Jan. 29, 2019, 10 pages.

Gopalan, S. et al., "An Improved Protection Strategy for Microgrids", 2013 4th IEEE PES Innovative Smart Grid Technologies Europe (ISGT Europe), Oct. 6-9, 2013, Copenhagen, 5 pages.

U.S. Appl. No. 16/418,062, filed May 21, 2019, Philippe Alibert.

* cited by examiner

METHOD FOR LOCATING PHASE FAULTS IN A MICROGRID

The present invention relates to a method for locating electrical faults in a microgrid, and in particular to a microgrid including distributed renewable and non-renewable energy sources.

BACKGROUND

A microgrid is basically a local electrical grid intended to generate and distribute electrical power in regions that are isolated and far from large electrical energy generation stations, such as, for example, islands, mountainous regions or desert areas. The microgrid principle is also applicable when it is desired for a building, neighborhood, campus or other entity connected to a wide distribution grid to manage the generation of its energy differently and e.g. increase its capacity for resilience. Thus, in general, a microgrid is an electrical installation integrating renewable and non-renewable energy sources and/or storage that is able to operate in both on-grid mode, that is connected to a utility grid, and in off-grid mode.

Microgrids may be made up of various kind of energy resources that are spatially distributed and disconnected from a main i.e. utility grid, also referred to as distributed energy resources DER. Such microgrids are set up as autonomous islands for energy supply. These distributed resources may include renewable energy resources, such as photovoltaic cells, solar panels and wind turbines. They further may include engine-generator energy resources, such as fuel consuming engines or turbines. And they may comprise energy storage facilities for locally storing energy, which may include chemical type storage such as batteries or mechanical type storage such as flywheels. As common for electrical installations, the various local parts are referred to as feeder bays or feeders in short, which are connected to busbars having a single voltage in order to distribute the energy.

An illustrative example of a microgrid is shown schematically in FIG. 1. The microgrid may functionally be split into a resource plane, a network plane and a control plane. The resource plane includes the distributed energy resources of renewable, generator and storage resources. In turn, each of the different types of energy resources may be collectively organized in distinct plants, such as a renewable plant, a generator set plant and a storage plant. The network plane includes the distribution network and loads to which energy is supplied. The control plane includes the local controllers for each plant of energy resource types and an overall microgrid central controller for centrally controlling the coordination between the different energy plants.

As renewable energy sources operate as DC sources, these are equipped with inverters in order to provide an AC signal that may be coupled to the grid. The AC signals provided by the inverters need to match the grid in both phase and magnitude. In order to ensure proper electrical coupling to the grid, the connections to the grid are supervised/monitored via Protection Relays operating electrical switch gear equipment, such as circuit breakers, enabling to disconnect one or more of the energy resources from the grid. This would for example be required in case of short circuit currents occurring in either the microgrid grid or the grid.

The inverters of these renewable resources are characterized by low short circuit capacity. In case of electrical faults, inverter-based sources limit the short-circuit currents to values not much higher than the nominal current to protect the inverter itself.

When installations with photovoltaic and storage resources operate in on-grid mode, the short circuit currents delivered from the grid in case of electrical fault are high, and traditional overcurrent protection is used. When these installations operate in off-grid mode, the short circuit currents are low and cannot be detected by overcurrent protection devices—at least for some feeders. Residual Current Devices can be used to detect phase to ground faults. However, phase faults, including both phase to phase faults, phase to neutral faults and three phase faults, remain undetected, presenting a risk of fire within few seconds. Accordingly, additional methods for detecting, locating and protecting microgrids are required.

In particular, methods are required to detect and isolate phase electrical faults for installations powered by distributed renewable and storage resources, and which are able to operate disconnected from a main grid.

SUMMARY OF INVENTION

It is an object of the invention to provide a method that allows to detect phase faults on a microgrid in off-grid mode.

In case of an electrical fault, all energy sources will deliver a maximal current, the majority of which contributing to feed the electrical fault. Each fault location is characterized by a unique "signature"—defined by a unique current flow and current magnitude at each point of the installation, which may be used to identify the fault location.

The proposed method uses a centralized software-based system communicating with the protection and measurement units at every feeder and all voltage relays installed at source busbars.

In on-grid mode, protection may be assured by overcurrent protection devices as known.

In off-grid mode, the presence of fault is identified by the software system as follows:

Identifying presence of a fault through detection of a voltage drop at at least one source busbar. Determining the fault location through analysis of the current and voltage magnitudes and current direction in each feeder. Wherein the current direction may be determined by measurements from phase directional elements. Once the fault is localized, a tripping order may be sent to the nearest switchgear equipment, such as one or more circuit breakers, to disconnect the faulty part from sources feeding the located fault.

Particular embodiments of the invention are set forth in the dependent claims.

Further objects, aspects, effects and details of the invention are described in the following detailed description of a number of exemplary embodiments, with reference to the drawings.

BRIEF DESCRIPTION OF DRAWINGS

By way of example only, the embodiments of the present disclosure will be described with reference to the accompanying drawing, wherein.

DETAILED DESCRIPTION

Figure 2:
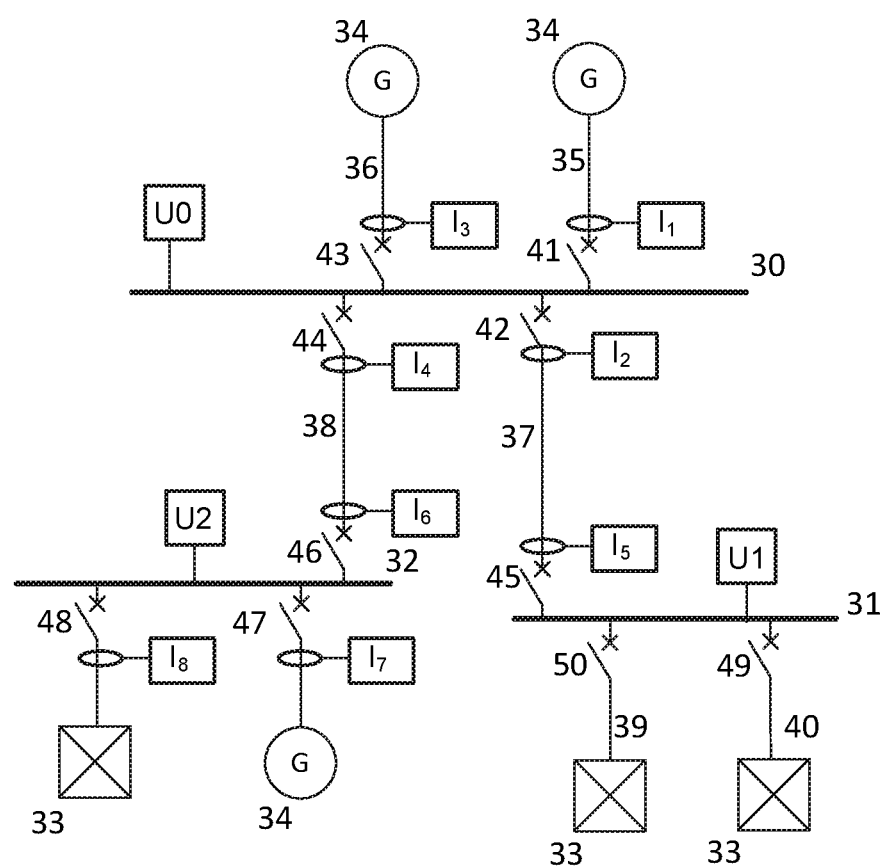
FIG. 2 shows an example of a single line diagram of a microgrid.

Referring to FIG. 2, a single line diagram is shown representing an example of a microgrid. The microgrid has three busbars 30, 31 and 32 connecting various loads 33 and different energy resources 34. The energy resources 34 may be non-renewable, such as fueled generators, or renewable, such as photovoltaic cells. Each connection may be referred to as a feeder bay or feeder in short. Each feeder may be connected and disconnected by a corresponding circuit breaker 41-50 from the respective busbar. For example, busbar 30 has two circuit breakers 41 and 43 controlling connection to two energy resources 34 via respective feeder 35 and 36, one circuit breaker 42 controlling connection to busbar 31 via feeder 37, and one circuit breaker 44 controlling connection to busbar 32 via feeder 38. Additional circuit breakers 45 and 46 may be used to further control connection of busbars 31 and 32 respectively. The feeders of busbars 31 and 32 are also provided with further circuit breakers 47, 48 and 49, 50. Each circuit breaker includes a control element that is communicatively connected to a central microgrid controller.

The microgrid is a three phase system, so there are three phase-to-phase voltages Uab, Ubc and Uca and three phase-to-neutral voltages Uan, Ubn and Ucn. The microgrid has voltage measurement devices U0-U2 and current measurement devices $I_1$-$I_8$. The current measurement devices may be integrated in the control elements of each respective circuit breaker or may be provided as separate devices. The voltage measurement devices U0-U2 measure each of the voltages for the respective busbars 30-32. The current measurement devices $I_1$-$I_8$ measure the current in each phase for the respective feeders. A phase directional element is also provided for each circuit breaker, preferably as part of the control element. Based on the measured phase-to-phase voltages the phase direction of the current may be determined.

In other examples, distinct phase directional elements may be present, capable of determining current direction. The measurements may be based on phasors obtained by Fourier analysis i.e. signal processing.

Figure 1:
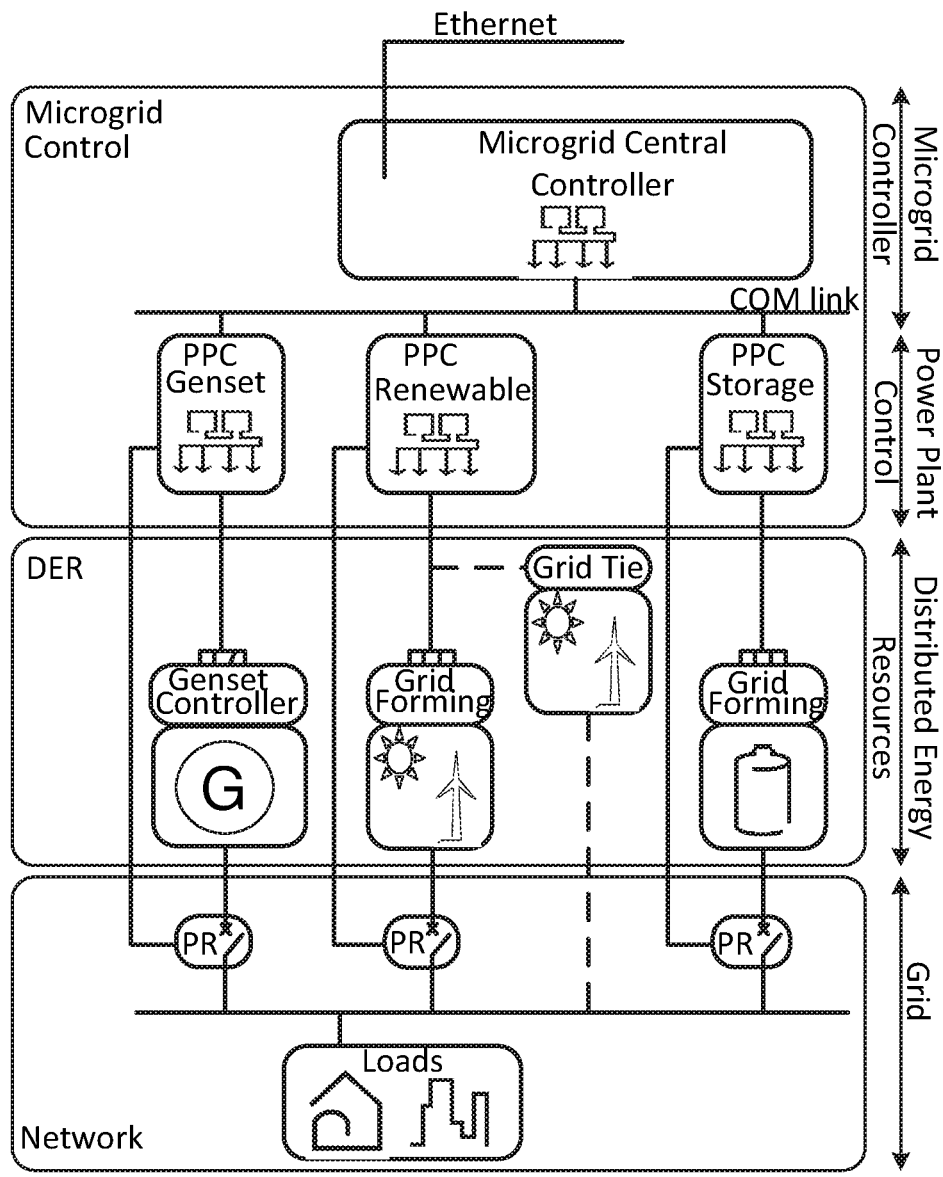
FIG. 1 illustrates schematically an example of a microgrid.

Current measurements for all feeders should be available. In addition, the position or state, open or closed, of all relevant circuit breakers 41-50 should be known. These elements determine a grid topology of the microgrid. The general grid topology may be known in advance, e.g. from the design phase or engineering process, and may be available from a file stored within a control system of the microgrid. For example, within the IEC 61850 framework, the topology may be e.g. obtained from the substation section of a .SCD or .SSD file which comply with standard configuration file formats. The storage and access may be arranged by a central controller, e.g. the microgrid central controller of FIG. 1. The position of all circuit breakers would also be available from the same central controller.

Figure 3:
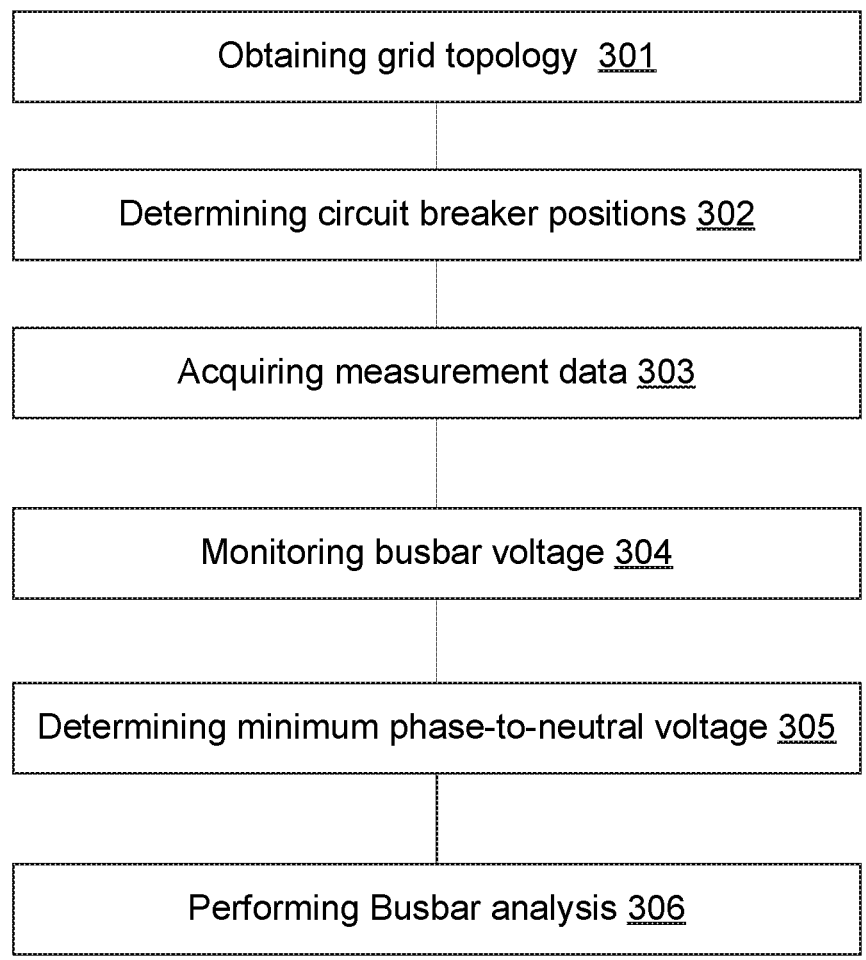
FIG. 3 shows an example of a method in accordance with the invention.

Referring to FIG. 3, an example of a method for locating phase faults in a microgrid in off-grid mode is shown. The method includes obtaining 301 a grid topology of the microgrid to assess the number of busbars present and if they are interconnected. Thereto the grid topology includes the position of circuit breakers and all busbars connected in the microgrid. Thus, the method further includes determining from the grid topology the positions of all circuit breakers 302 of the microgrid. Then acquiring current measurement data 303, the measurement data including phase voltage magnitudes for all busbars, current magnitude and current direction for all circuit breakers. The measurement data may be acquired continuously, or only when triggered on detecting a phase fault.

The method further includes monitoring the one or more busbars 304 in the microgrid for a voltage dip on for all six phase voltages. When a voltage dip is detected on at least one monitored busbar, determining a phase having a minimum phase-to-neutral voltage 305 value. And for the phase having the minimum phase-to-neutral voltage, performing busbar analysis 306. The busbar analysis is performed consecutively, starting from one busbar proceeding to a next busbar until the phase fault is located.

As mentioned, in the example of a microgrid of FIG. 2 for each circuit breaker a phase directional element is provided. In general, a phase directional element may determine a current direction based on the phase angle of a polarizing voltage. Which same principle is for example used in overcurrent protection relays referred to as ANSI 67 by IEEE or IEC60255-12 standard or RDIR logical node by of IEC 68150. Accordingly, the method for locating phase faults in the microgrid as described in relation to FIG. 3, is based on current magnitude data and phase directional data derived from voltage measurement data.

Figure 4:
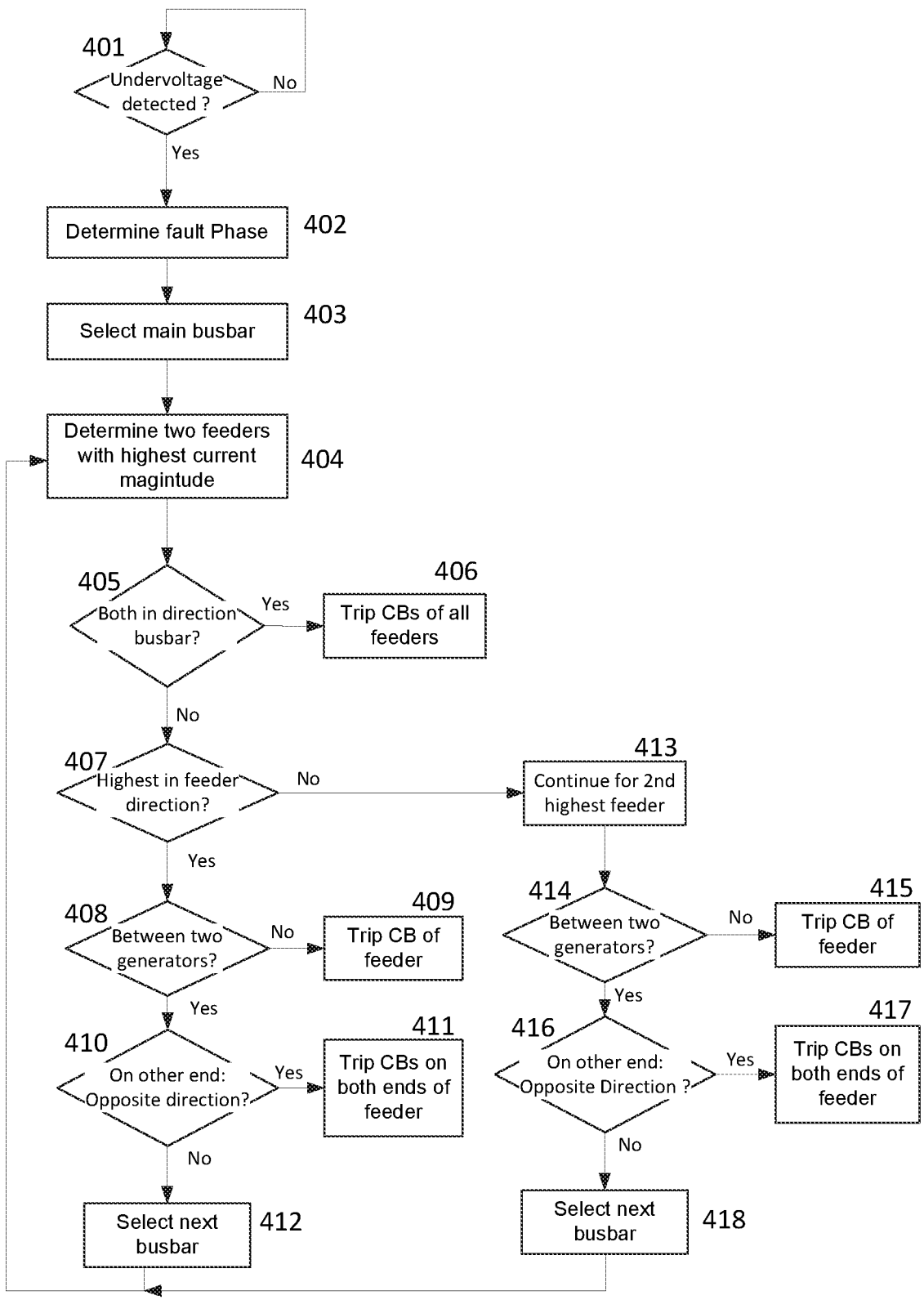
FIG. 4 shows an example of a flow chart for an example of a method based on phase directional and current magnitude measurements in accordance with the invention.

Turning to FIG. 4 an example of a flowchart for an example of performing busbar analysis according to the method is shown. On detection of an undervoltage 401 and determination of the defect i.e. faulty phase 402, busbar analysis is initiated. Performing busbar analysis preferably starts by selecting 403 a main or primary busbar, that is a busbar to which all other secondary busbars are connected. The busbar analysis may also start with a busbar to which one energy source is connected. Or it may be chosen to start randomly from one busbar among the busbars present in the microgrid. Performing busbar analysis includes determining, based on current magnitude data, at least two feeders 404 of a first busbar, which feeders have a maximum phase current for the phase having the minimum phase-to-neutral voltage. Performing busbar analysis further includes determining, based on phase directional data, the phase current direction 405 of the at least two busbar feeders having the maximum current.

The selection of feeders with the highest feeder currents is based on the assumption that this will indicate a direction of a short circuit path.

If the current direction for both these at least two feeders having a maximum current is in the busbar direction, the phase fault is on the busbar, and all circuit breakers 406 associated with feeders of that busbar are tripped. In that case, no further analysis is required. In the example of FIG. 2, if the busbar analysis starts with main busbar 30 and the current measurement devices $I_3$ and $I_4$ indicate the highest currents for the associated feeders and the direction would be busbar for both, then all circuit breakers 41-44 of busbar 30 would be tripped.

If the current direction for both these at least two feeders having a maximum current is not in the busbar direction, the busbar analysis further includes performing feeder analysis.

If the current direction of a first feeder having a highest maximum current of these at least two feeders having a maximum current is in a feeder direction 407, so away from the busbar, the phase fault is located downstream in that feeder having the highest maximum current, and further conditions are checked. In the example of FIG. 2, this could be the current direction as determined by the measurement devices $I_1$-$I_2$ associated circuit breaker 41-42.

In the event that the first feeder having a highest maximum current is not between two generators 408 i.e. there is no further generator downstream of the feeder or downstream busbar connected to the feeder, a circuit breaker 409 of that first feeder is tripped. In the example of FIG. 2 that would be e.g. the feeder associated with current measurement device 12 and circuit breaker 42 would be tripped.

In the event that the first feeder is between two generators, meaning that there is a further generator downstream, then the current direction of a second phase directional element in the same feeder on another end thereof is determined. The second phase directional element being on the other end means that it is closer to another busbar. A feeder may be regarded as a transmission line of which both sides are controlled by circuit breakers and associated with means for current and phase directional measurements.

If the current direction as indicated by the second phase directional element is opposite to the direction 410 of the first phase directional element, i.e. also feeder direction, both circuit breakers 411 associated with first and second phase directional elements are tripped. In the example of FIG. 2, this would be circuit breakers 44 and 46. For sake of clarity, if the respective currents at circuit breakers 44 and 46 are opposite, they are both directed into the feeder and both away from their respective busbars 30 and 32.

If the current direction as indicated by the second phase directional element is the same as the direction of the first phase directional element, i.e. busbar/downstream, a next busbar further downstream is selected 412 for continuing performing busbar analysis. In the example of FIG. 2, this would be busbar 32. In that case, all the above steps of performing busbar analysis are repeated for busbar 32.

However, if the current direction of the first feeder having the highest maximum current of these at least two feeders having a maximum current is not in a feeder direction, but in the busbar/upstream direction then feeder analysis is performed for the second feeder having a second highest maximum current, as indicated by stage 413 in FIG. 4. In the example of FIG. 2, this could be the current direction as determined by the measurement device 12 of associated circuit breaker 42.

Hence, again as with stage 408, it is again checked if the feeder is between two generators 414. And if not, the associated circuit breaker of the feeder is tripped 415. It the feeder is between two generators, as with stage 410, it is checked if the direction at the other end of the feeder is opposite 416. If yes, both associated circuit breakers are tripped 417. If not, a next busbar 418 further downstream is selected for performing busbar analysis.

Thus, busbar analysis includes feeder analysis which is performed for one or both feeders of the two feeders having maximum current.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A method for locating phase faults in a microgrid in off-grid mode comprising:
   obtaining a grid topology of the microgrid having at least two busbars to monitor;
   determining circuit breaker position data of all circuit breakers of the grid topology;
   acquiring measurement data, the data comprising current magnitude and voltage magnitude;
   monitoring the at least two busbars for a voltage dip in one of phase-to-phase or phase-to-neutral voltages; and
   on detecting the voltage dip:
      determining a defect phase having a minimum phase-to-neutral voltage value from a plurality of phases; and
      for the determined defect phase, performing busbar analysis to locate a phase fault on the defect phase and protect the microgrid in the off-grid mode,
   wherein the bus bar analysis comprises:
      determining, based on phase directional data, a phase current direction of at least two feeders of a busbar from the at least two busbars, the feeders having a maximum phase current for the defect phase having the minimum phase-to-neutral voltage;
      IF the current direction for the at least two feeders having a maximum current is in the busbar direction, tripping all circuit breakers associated with the at least two feeders to the busbar from the at least two busbars;
      ELSE performing feeder analysis, comprising:
         IF direction of a highest current is in a feeder direction,
            AND IF a feeder of the at least two feeders having said highest current is not between two generators, tripping the feeder with time delay; OR
            AND IF the feeder is between two generators, determining a current phase direction of a second directional phase measurement device in the same line of the feeder, AND THEN
               IF the current phase direction of the second measurement device is in the feeder direction, tripping both associated circuit breakers of the first and second measurement device; OR
               IF the current phase direction of the second measurement device is to the busbar from the at least two busbars, locating fault by a busbar phase directional analysis for a downstream busbar from the at least two busbars:
         IF the direction of said highest current is in the busbar direction and a direction of a second highest current is in the feeder direction, AND
            IF the feeder having said second highest current is not between two generators, tripping the feeder with a time delay; OR
            IF the feeder having said second highest current is between two generators, determining a current phase direction of a second directional phase measurement device in same line of the feeder, AND THEN
               IF the current phase direction of the second measurement device is in the feeder direction, tripping both associated circuit breakers of the first and second measurement device;

IF the current phase direction of the second measurement device is to the busbar from the at least two busbars, locating fault by busbar phase directional analysis for a downstream busbar from the at least two busbars.

2. The method according to claim 1, wherein performing busbar analysis comprises:
determining, based on the current magnitude data, at least two feeders having a maximum phase current for the defect phase having the minimum phase-to-neutral voltage; and
determining, based on phase directional data, a phase current direction of the at least two feeders having the maximum current; and
if the current direction for both the at least two feeders having the maximum current is in the busbar direction, generating a signal for tripping all circuit breakers associated with feeders of the busbar under analysis.

3. The method according to claim 2, wherein performing busbar analysis comprises:
if the current direction of one feeder having a highest maximum current of the at least two feeders is in a feeder direction, performing feeder analysis for the one feeder; or
if the current direction of the one feeder having the highest maximum current of the at least two feeders having the maximum current is in a busbar direction, performing feeder analysis for a second feeder of the at least two feeders having the maximum current.

4. The method according to claim 3, wherein performing feeder analysis comprises:
if the feeder under analysis is not between two generators, tripping a circuit breaker corresponding to that feeder with a predetermined time delay; or
if the feeder under analysis is between two generators, determining a current direction of a second directional phase element on an opposite end of the feeder, and then:
if the current phase direction of the second measurement device is towards the feeder, tripping both circuit breakers associated with the first and second phase directional element; or
if the current direction of the second phase directional element is towards a downstream busbar, locating the fault by performing busbar analysis for that downstream busbar.

5. The method according to claim 1, wherein the method is a computer implemented method.

6. A computer program product, comprising a computer program with instructions which, when executed on at least one processor, cause the at least one processor to carry out the method according to claim 1.

7. A computer readable medium having stored thereon computer executable code for execution by computer processors controlling a microgrid, wherein execution of the instructions of the executable code causes the computer processors to execute the computer-implemented method of claim 1 on the microgrid.

8. A microgrid central controller, comprising:
communication means for collecting measurement data from measurement devices and exchanging control data with control devices;
at least one computer processor for executing instructions; and
a computer program product, comprising a computer program with instructions which, when executed on the at least one processor, cause the at least one computer processor to carry out the method according to claim 1.

9. A method for locating phase faults in a microgrid in an off-grid mode comprising:
on detecting a voltage dip, determining a defect phase having a minimum phase-to-neutral voltage value from a plurality of phases;
for the determined defect phase, performing busbar analysis to locate a phase fault on the defect phase and protect the microgrid in the off-grid mode, the bus bar analysis comprising:
determining, based on phase directional data, a phase current direction of at least two feeders of a busbar, the feeders having a maximum phase current for the defect phase having the minimum phase-to-neutral voltage;
IF the current direction for the at least two feeders having a maximum current is in the busbar direction, tripping all circuit breakers associated with the at least two feeders to the busbar;
ELSE performing feeder analysis, comprising:
IF direction of a highest current is in a feeder direction,
AND IF a feeder of the at least two feeders having said highest current is not between two generators, tripping the feeder with time delay; OR
AND IF the feeder is between two generators,
determining a current phase direction of a second directional phase measurement device in the same line of the feeder, AND THEN
IF the current phase direction of the second measurement device is in the feeder direction, tripping both associated circuit breakers of the first and second measurement device; OR
IF the current phase direction of the second measurement device is to the busbar, locating fault by a busbar phase directional analysis for a downstream busbar;
IF the direction of said highest current is in the busbar direction and a direction of a second highest current is in the feeder direction, AND
IF the feeder having said second highest current is not between two generators, tripping the feeder with a time delay; OR
IF the feeder having said second highest current is between two generators, determining a current phase direction of a second directional phase measurement device in same line of the feeder, AND THEN
IF the current phase direction of the second measurement device is in the feeder direction, tripping both associated circuit breakers of the first and second measurement device;
IF the current phase direction of the second measurement device is to the busbar, locating fault by busbar phase directional analysis for a downstream busbar.

10. The method according to claim 1, wherein, for the determined defect phase, the busbar analysis is performed consecutively, starting from one busbar of the at least two busbars proceeding to a next busbar of the at least two busbars until the phase fault is located on the defect phase.

11. The method according to claim 1, wherein each of the circuit breakers includes a phase directional element for determining a phase direction of current or obtaining measurements to determine a phase direction of current.

* * * * *